(12) United States Patent
Lee et al.

(10) Patent No.: US 9,812,471 B2
(45) Date of Patent: Nov. 7, 2017

(54) LASER ANNEALING APPARATUS AND METHOD OF MANUFACTURING DISPLAY APPARATUS BY USING THE SAME

(71) Applicant: SAMSUNG DISPLAY CO., LTD., Yongin-si, Gyeonggi-Do (KR)

(72) Inventors: Hongro Lee, Yongin-si (KR); Chunghwan Lee, Yongin-si (KR)

(73) Assignee: SAMSUNG DISPLAY CO., LTD., Yongon-Si, Gyeonggi-Do (KR)

( * ) Notice: Subject to any disclaimer, the term of this patent is extended or adjusted under 35 U.S.C. 154(b) by 0 days.

(21) Appl. No.: 15/059,049

(22) Filed: Mar. 2, 2016

(65) Prior Publication Data

US 2017/0040352 A1  Feb. 9, 2017

(30) Foreign Application Priority Data

Aug. 7, 2015  (KR) ........................ 10-2015-0111636

(51) Int. Cl.
| | |
|---|---|
| *H01L 21/02* | (2006.01) |
| *H01L 27/12* | (2006.01) |
| *H01L 21/67* | (2006.01) |
| *H01L 21/268* | (2006.01) |

(52) U.S. Cl.
CPC .... *H01L 27/1285* (2013.01); *H01L 21/02675* (2013.01); *H01L 21/02678* (2013.01); *H01L 21/02691* (2013.01); *H01L 21/268* (2013.01); *H01L 21/67115* (2013.01)

(58) Field of Classification Search
CPC ........... H01L 21/67115; H01L 27/1285; H01L 21/02678; H01L 21/02691; H01L 2121/268; H01L 21/02675
See application file for complete search history.

(56) References Cited

U.S. PATENT DOCUMENTS

| | | | |
|---|---|---|---|
| 5,953,597 A | 9/1999 | Kusumoto et al. | |
| 8,237,085 B2 * | 8/2012 | Tanaka | G02B 5/005 |
| | | | 219/121.74 |
| 2011/0097907 A1 | 4/2011 | Kawaguchi et al. | |
| 2012/0111267 A1 | 5/2012 | Park | |

FOREIGN PATENT DOCUMENTS

| | | |
|---|---|---|
| JP | 2001-332493 | 11/2001 |
| KR | 10-2012-0048239 | 5/2012 |
| WO | WO 2009-157373 | 12/2009 |

* cited by examiner

*Primary Examiner* — Savitr Mulpuri
(74) *Attorney, Agent, or Firm* — F. Chau & Associates, LLC

(57) ABSTRACT

A laser annealing apparatus includes a substrate supporter that receives a substrate having an amorphous silicon layer, a laser beam irradiation unit that irradiates a line laser beam onto the substrate disposed on the substrate supporter, and a substrate transport unit that moves the substrate supporter in the first direction and in a second direction crossing the first direction and rotates the substrate supporter within a first plane defined by the first direction and the second direction. The substrate transport unit rotates the substrate supporter by an angle θ less than about 90 degrees within the first plane and moves the substrate supporter both in the first direction and in the second direction at substantially the same time. The laser beam irradiation unit irradiates the line laser beam multiple times onto the substrate disposed on the substrate supporter while the substrate transport unit moves the substrate supporter.

18 Claims, 15 Drawing Sheets

LASER ANNEALING APPARATUS AND METHOD OF MANUFACTURING DISPLAY APPARATUS BY USING THE SAME

CROSS-REFERENCE TO RELATED APPLICATIONS

This application claims priority under 35 U.S.C. §119 to Korean Patent Application No. 10-2015-0111636, filed on Aug. 7, 2015, the disclosure of which is incorporated by reference herein in its entirety.

TECHNICAL FIELD

Exemplary embodiments of the inventive concept relate to a laser annealing apparatus and a method of manufacturing a display apparatus by using the same, and more particularly, to a laser annealing apparatus capable of reducing an occurrence rate of defects during a manufacturing procedure, and a method of manufacturing a display apparatus by using the laser annealing apparatus.

DISCUSSION OF THE RELATED ART

Generally, a display apparatus, such as an organic light-emitting display (OLED) apparatus or a liquid crystal display (LCD) apparatus, controls emission or an emission degree of pixels by using a thin film transistor (TFT) electrically connected to a pixel electrode in each pixel of the display apparatus. The TFT includes a semiconductor layer including a polysilicon layer. During manufacture of the display apparatus, an amorphous silicon layer of the display apparatus is transformed into the polysilicon layer.

Transformation of the amorphous silicon layer into the polysilicon layer may occur during a crystallization process in which a laser annealing method of irradiating a laser beam onto the amorphous silicon layer is performed. In this case, the laser beam irradiated onto the amorphous silicon layer is a line laser beam extending in a substantially straight direction. Thus, to transform the amorphous silicon layer, which may span a large area, into a polysilicon layer, the line laser beam is irradiated multiple times while a substrate on which the amorphous silicon layer is formed is moved.

SUMMARY

Exemplary embodiments of the inventive concept include a laser annealing apparatus for reducing an occurrence rate of defects during a manufacturing procedure and a method of manufacturing a display apparatus by using the same.

According to an exemplary embodiment of the inventive concept, a laser annealing apparatus includes a substrate supporter configured to receive a substrate having an amorphous silicon layer, a laser beam irradiation unit configured to irradiate a line laser beam onto the substrate disposed on the substrate supporter, in which the line laser beam extends in a first direction, and a substrate transport unit configured to move the substrate supporter in the first direction and in a second direction crossing the first direction, and rotate the substrate supporter within a first plane defined by the first direction and the second direction. The substrate transport unit is configured to rotate the substrate supporter by an angle θ less than about 90 degrees within the first plane, and move the substrate supporter both in the first direction and in the second direction at substantially a same time in a state where the substrate supporter is rotated by the angle θ. The laser beam irradiation unit is configured to irradiate the line laser beam multiple times onto the substrate disposed on the substrate supporter while the substrate transport unit moves the substrate supporter.

In an exemplary embodiment, the first direction and the second direction are substantially perpendicular to each other, the substrate transport unit moves the substrate supporter in the second direction at a velocity of V, and the substrate transport unit moves the substrate supporter in the first direction at a velocity of V*tan(θ).

In an exemplary embodiment, the laser annealing apparatus further includes a first beam cutter and a second beam cutter spaced apart from the first beam cutter. The first and second beam cutters are configured to move in the first direction or in a second direction opposite to the first direction to increase or decrease a shield area in which the line laser beam emitted by the laser beam irradiation unit is shielded.

In an exemplary embodiment, the first beam cutter is configured to move to decrease the shield area while the substrate transport unit moves the substrate supporter in the second direction.

In an exemplary embodiment, the second beam cutter is configured to move to increase the shield area while the substrate transport unit moves the substrate supporter in the second direction.

In an exemplary embodiment, the laser annealing apparatus further includes a chamber and a window. The laser beam irradiation unit is located outside the chamber, the substrate supporter is located within the chamber, the first and second beam cutters are located within the chamber, and the line laser beam emitted by the laser beam irradiation unit passes through the window and is irradiated onto the substrate disposed on the substrate supporter.

In an exemplary embodiment, the laser annealing apparatus further includes a first beam cutter and a second beam cutter. The first and second beam cutters are configured to rotate in a clockwise direction or a counterclockwise direction within a second plane substantially parallel to the first plane to increase or decrease a shield area in which the line laser beam emitted by the laser beam irradiation unit is shielded.

In an exemplary embodiment, the first beam cutter is configured to move to decrease the shield area in which the line laser beam emitted by the laser beam irradiation unit is shielded while the substrate transport unit moves the substrate supporter in the second direction.

In an exemplary embodiment, the second beam cutter is configured to move to increase the shield area in which the line laser beam emitted by the laser beam irradiation unit is shielded while the substrate transport unit moves the substrate supporter in the second direction.

In an exemplary embodiment, the laser annealing apparatus further includes a chamber and a window. The laser beam irradiation unit is located outside the chamber, the substrate supporter is located within the chamber, the first and second beam cutters are located within the chamber, and the line laser beam emitted by the laser beam irradiation unit passes through the window and is irradiated onto the substrate disposed on the substrate supporter.

According to an exemplary embodiment of the inventive concept, a method of manufacturing a display apparatus includes irradiating a line laser beam onto an amorphous silicon layer formed on a substrate to transform the amorphous silicon layer into a polysilicon layer, in which the line laser beam extends in a first direction. Irradiating the line laser beam includes irradiating the line laser beam multiple times while the substrate is moved in both the first direction and in a second direction crossing the first direction at substantially a same time. The line laser beam is irradiated while the substrate is rotated by an angle θ less than about 90 degrees within a first plane defined by the first direction and the second direction.

In an exemplary embodiment, the first direction and the second direction are substantially perpendicular to each other, the substrate is moved in the second direction at a velocity of V, and the substrate is moved in the first direction at a velocity of V*tan(θ).

In an exemplary embodiment, irradiating the line laser beam further includes shielding at least some of the line laser beam by a beam cutter while the substrate is moved in the second direction, and decreasing a shield area in which the line laser beam is shielded by moving the beam cutter in the first direction or in a direction opposite to the first direction while the substrate is moved in the second direction.

In an exemplary embodiment, irradiating the line laser beam further includes irradiating the line laser beam onto the amorphous silicon layer of the substrate through a window of a chamber. The substrate having the amorphous silicon layer and the beam cutter are located within the chamber.

In an exemplary embodiment, irradiating the line laser beam further includes shielding at least some of the line laser beam by a beam cutter while the substrate is moved in the second direction, and increasing a shield area in which the line laser beam is shielded by moving the beam cutter in the first direction or in a direction opposite to the first direction while the substrate is moved in the second direction.

In an exemplary embodiment, irradiating the line laser beam further includes irradiating the line laser beam onto the amorphous silicon layer of the substrate through a window of a chamber. The substrate having the amorphous silicon layer and the beam cutter are located within the chamber.

In an exemplary embodiment, irradiating the line laser beam further includes shielding at least some of the line laser beam by a beam cutter while the substrate is moved in the second direction, and decreasing a shield area in which the line laser beam is shielded by rotating the beam cutter in a clockwise direction or in a counterclockwise direction within a plane substantially parallel to the first plane while the substrate is moved in the second direction.

In an exemplary embodiment, irradiating the line laser beam further includes irradiating the line laser beam onto the amorphous silicon layer of the substrate through a window of a chamber. The substrate having the amorphous silicon layer and the beam cutter are located within the chamber.

In an exemplary embodiment, irradiating the line laser beam further includes shielding at least some of the line laser beam by a beam cutter while the substrate is moved in the second direction, and increasing a shield area in which the line laser beam is shielded by rotating the beam cutter in a clockwise direction or in a counterclockwise direction within a plane substantially parallel to the first plane while the substrate is moved in the second direction.

In an exemplary embodiment, irradiating the line laser beam further includes irradiating the line laser beam onto the amorphous silicon layer of the substrate through a window of a chamber. The substrate having the amorphous silicon layer and the beam cutter are located within the chamber.

According to an exemplary embodiment of the inventive concept, a method of manufacturing a display apparatus includes rotating a substrate supporter by an angle θ less than about 90 degrees within a first plane defined by a first direction and a second direction crossing the first direction, in which a substrate having an amorphous silicon layer is disposed on the substrate supporter. The method further includes irradiating a line laser beam onto the amorphous silicon layer, in which the line laser beam extends in the first direction. The method further includes moving the rotated substrate supporter having the substrate disposed thereon in the first direction and in the second direction at substantially a same time. The line laser beam is irradiated multiple times onto the substrate while the substrate supporter is moved in the first direction and in the second direction.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
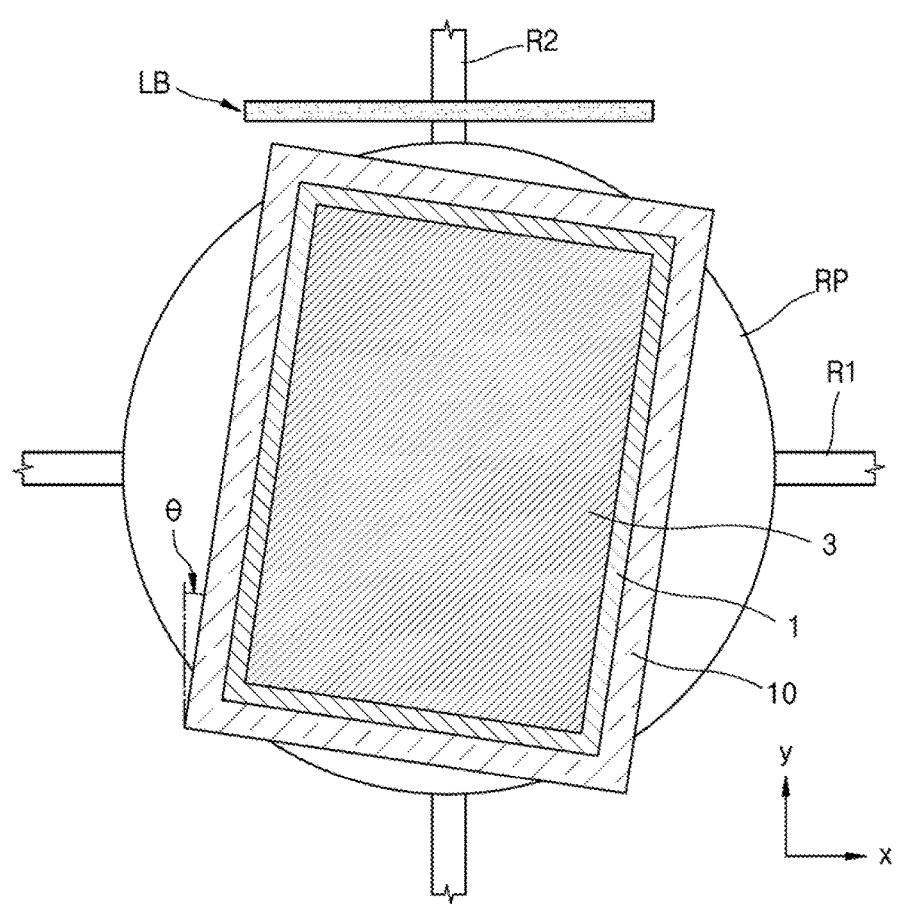
FIGS. 1 to 3 illustrate schematic plan views of a method of manufacturing a display apparatus by using a laser annealing apparatus according to an exemplary embodiment of the inventive concept.

Exemplary embodiments of the inventive concept will be described more fully hereinafter with reference to the accompanying drawings. In the drawings, the size and relative sizes of layers and regions may be exaggerated for clarity. Like reference numerals may refer to like elements throughout the accompanying drawings.

It will be understood that when a component, such as a layer, a film, a region, a plate, etc. is referred to as being "on" another component, the component can be directly on the other component or intervening components may be present thereon. Sizes and thicknesses of components in the drawings may be exaggerated for convenience of explanation.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. Further, it is to be understood that while parameters may be described herein as having "about" a certain value, according to exemplary embodiments, the parameter may be exactly the certain value or approximately the certain value. Further, when events are described as occurring at substantially the same time, it is to be understood that the events may occur at exactly the same time or at about the same time as would be understood by a person having ordinary skill in the art. Further, when two directions are described as being substantially parallel or perpendicular to each other, it is to be understood that the two directions are exactly parallel or perpendicular to each other, or are approximately parallel or perpendicular to each other as would be understood by a person having ordinary skill in the art.

In the exemplary embodiments described herein, the x-axis, the y-axis and the z-axis are not limited to three axes of the rectangular coordinate system, and may be interpreted in a broader sense. For example, the x-axis, the y-axis, and the z-axis may be substantially perpendicular to one another, or may represent different directions that are not substantially perpendicular to one another.

Figure 2:
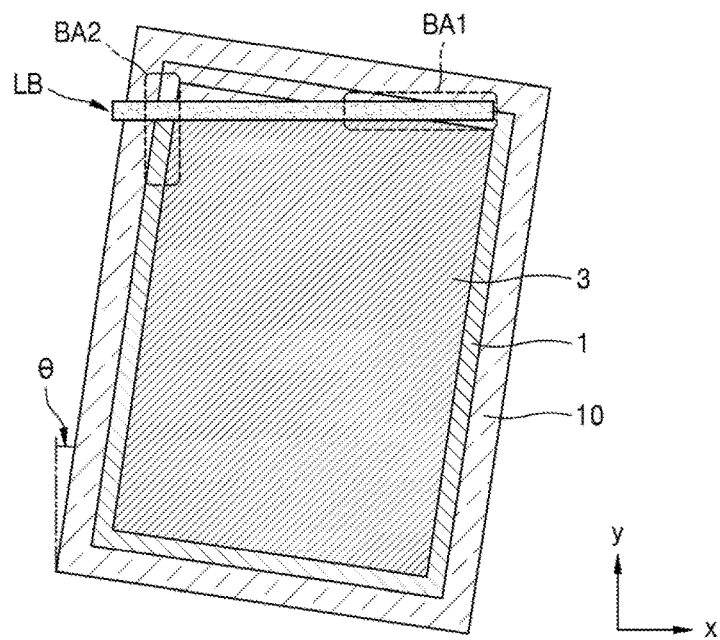
Figure 3:
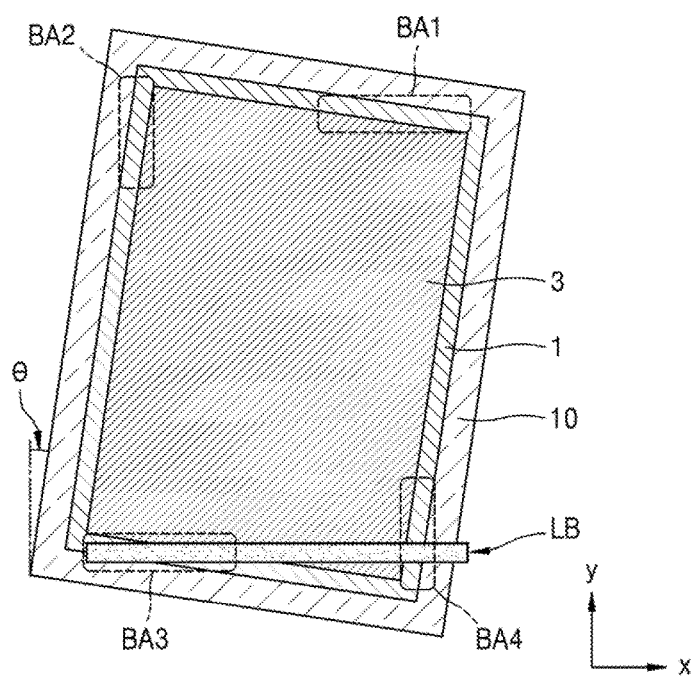

FIGS. 1 to 3 illustrate schematic plan views of a method of manufacturing a display apparatus by using a laser annealing apparatus according to an exemplary embodiment of the inventive concept. In an exemplary embodiment, the laser annealing apparatus includes a substrate supporter 10, a laser beam irradiation unit, and a substrate transport unit.

The substrate supporter 10 is configured (e.g., shaped and dimensioned) to receive a substrate 1 on which an amorphous silicon layer 3 is formed. That is, a substrate 1 on which an amorphous silicon layer 3 is formed may be arranged on the substrate supporter 10. The substrate transport unit may transport (e.g., move) the substrate supporter 10. For example, the substrate transport unit may move the substrate supporter 10 in a first direction (e.g., +x direction) or a second direction (e.g., +y direction) that crosses the first direction. The substrate transport unit may also rotate the substrate supporter 10 within a first plane (e.g., an xy plane) defined by the first direction (+x direction) and the second direction (+y direction). The second direction (+y direction) may be substantially perpendicular to the first direction (+x direction). However, exemplary embodiments of the inventive concept are not limited thereto. Hereinafter, for convenience of explanation, the second direction is understood to be substantially perpendicular to the first direction.

FIG. 1 shows the substrate transport unit including a first rail R1, a second rail R2, and a rotating plate RP. The first rail R1 may extend in the first direction (e.g., +x direction) and the second rail R2 may extend in the second direction (e.g., +y direction). The second rail R2 may locate over the first rail R1 such that the second rail R2 may be moved along the x-axis. The rotating plate RP may locate over the second rail R2 such that the rotating plate RP may be moved along the y-axis, i.e., the position of the rotating plate RP may vary in the xy-plane by the first rail R1 and the second rail R2. The rotating plate RP may rotate such that the substrate supporter 10 on the rotating plate RP may rotate at a predetermined angle. However, the scope of the inventive concept is not limited thereto. For example, the substrate transport unit may not include the rotating plate RP and the substrate supporter 10 may be rotatably linked to the second rail R2.

The laser beam irradiation unit may irradiate a line laser beam LB extending in the first direction (+x direction) onto the substrate 1 arranged on the substrate supporter 10. Herein, when the line laser beam LB is described as being irradiated onto a surface, it is to be understood that the line laser beam LB is applied to the surface. It is also understood that the line laser beam LB is emitted in a substantially straight line. One or more optical systems via which laser beams may pass may be arranged between the laser beam irradiation unit and the substrate 1 arranged on the substrate supporter 10. The laser beam irradiation unit may irradiate, for example, an excimer laser beam that is in a line form.

According to a comparative example, in a state in which a long or short axis of the substrate 1 is substantially perpendicular to the first direction (+x direction) that is an extension direction of the line laser beam LB, the substrate transport unit transports the substrate supporter 10 in the second direction (+y direction) substantially perpendicular to the first direction. While the substrate transport unit transports the substrate supporter 10, the laser beam irradiation unit irradiates the line laser beam LB onto the amorphous silicon layer 3 multiple times to thereby transform the amorphous silicon layer 3 arranged on the substrate 1 into a polysilicon layer. However, when a display apparatus is manufactured by using the polysilicon layer, uneven stripes may be generated in an image produced by the display apparatus.

For example, during laser annealing, among edges of the substrate 1, there are edges parallel to the first direction (+x direction) that are an extension direction of the line laser beam LB. Referring to the edges parallel to the first direction (+x direction) as first edges, when multiple thin film transistors are formed by using the polysilicon layer, threshold voltages Vth of the thin film transistors arranged on virtual lines respectively substantially parallel to the first edges of the substrate 1 may be substantially the same as each other, but threshold voltages Vth of thin film transistors arranged on different virtual lines may be different from each other. Thus, when display devices are manufactured to be electrically connected to the thin film transistors, an image produced by the display apparatus may have stripes substantially parallel to the first edges of the substrate 1.

Therefore, referring to the laser annealing apparatus according to an exemplary embodiment of the inventive concept, to prevent the generation of stripes, the substrate transport unit rotates the substrate supporter 10 on which the substrate 1 having the amorphous silicon layer 3 thereon is arranged by an angle θ less than about 90 degrees, as illustrated in FIG. 1. For example, when the substrate supporter 10 is straightly aligned in the second direction (y direction), the substrate transport unit may rotate the substrate supporter 10 by an angle θ, which is less than about 90 degrees relative to the previously straightly aligned substrate supporter 10. Once the substrate supporter 10 has been rotated, the substrate transport unit moves the rotated substrate supporter 10 in the second direction (+y direction), as illustrated in FIGS. 2 and 3.

When the laser annealing is performed as described above, the extension direction of the line laser beam LB (e.g., the +x direction) is not substantially parallel to the edges of the substrate 1. As a result, when thin film transistors are formed by using the polysilicon layer and then display devices electrically connected to the thin film transistors are formed, threshold voltages Vth of the thin film transistors arranged on the virtual lines that are respectively substantially parallel to the edges of the substrate 1 are different from each other. Accordingly, a distribution of the threshold voltages Vth of the thin film transistors on the substrate 1 is even over the substrate 1. Therefore, according to exemplary embodiments of the inventive concept, when a display apparatus is manufactured by forming the display devices electrically connected to the thin film transistors, the generation of stripes may be prevented or reduced.

In the case of the laser annealing apparatus and method of manufacturing the display apparatus, a substantial amount of portions of the substrate 1 may be damaged, and a defect rate may increase while the display apparatus is manufactured. For example, as illustrated in FIGS. 2 and 3, when the line laser beam LB is irradiated onto the amorphous silicon layer 3 formed on the substrate 1 multiple times while the substrate transport unit transports the substrate supporter 10 in the second direction (+y direction), the line laser beam LB is irradiated onto portions of the substrate 1 that are not covered by the amorphous silicon layer 3. For example, FIG. 2 illustrates that the line laser beam LB is irradiated onto an upper right area BA1 and an upper left area BA2 of the substrate 1, and FIG. 3 illustrates that the line laser beam LB is irradiated onto a lower left area BA3 and a lower right area BA4 of the substrate 1.

The amorphous silicon layer 3 may have a thickness of about 3,000 nm or more. As a result, the amorphous silicon layer 3 may absorb a large amount of the incident line laser beam LB (e.g., about 99% or more), and a portion of the substrate 1 that is below the amorphous silicon layer 3 may be hardly affected by the line laser beam LB. However, the upper right area BA1, the upper left area BA2, the lower left area BA3, and the lower right area BA4 of the substrate 1 where the amorphous silicon layer 3 does not exist may be damaged by the line laser beam LB. For example, when the substrate 1 includes, for example, polyimide or a similar substance (e.g., to implement a flexible display apparatus), the upper right area BA1, the upper left area BA2, the lower left area BA3, and the lower right area BA4 of the substrate 1 may partially burn. In addition, particles may be generated while the upper right area BA1, the upper left area BA2, the lower left area BA3, and the lower right area BA4 are burnt, and the generated particles may remain on the amorphous silicon layer 3 or a polysilicon layer, which may result in a defect being subsequently formed. Therefore, it is desirable to minimize an area of a portion of the substrate 1 where the amorphous silicon layer 3 does not exist and the line laser beam LB is irradiated.

In view of the foregoing, the amorphous silicon layer 3 may cover the entire substrate 1. However, although the amorphous silicon layer 3 covers the entire substrate 1, the thickness of the amorphous silicon layer 3 near the edges of the substrate 1 may be less than the thickness of the amorphous silicon layer 3 near the center of the substrate 1. Therefore, in this case, energy of the line laser beam LB may be transmitted to the substrate 1 without being sufficiently absorbed by the amorphous silicon layer 3, and the problems described above may occur.

Alternatively, the line laser beam LB may not be irradiated onto a portion of the substrate 1 that is not covered by the amorphous silicon layer 3 by reducing a length of the line laser beam LB in the first direction (+x direction). However, in this case, the line laser beam LB may not be irradiated onto some portions of the amorphous silicon layer 3, and thus, the amorphous silicon layer 3 may not be crystallized.

Figure 4:
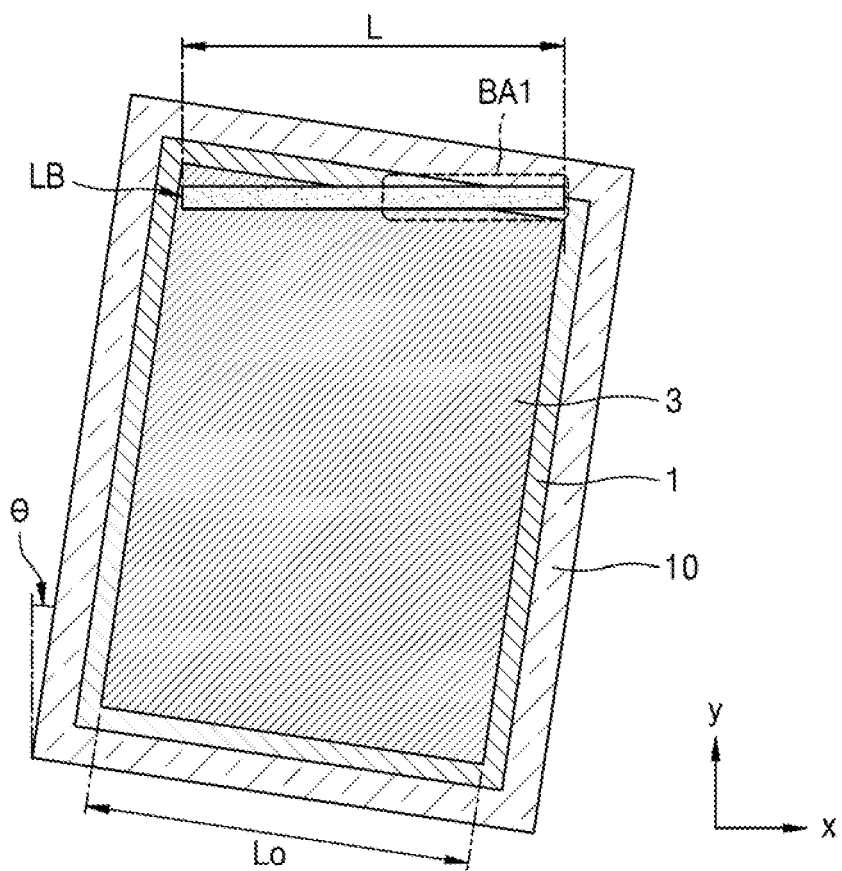
FIGS. 4 to 6 illustrate schematic plan views of a method of manufacturing a display apparatus by using a laser annealing apparatus according to an exemplary embodiment of the inventive concept.
Figure 5:
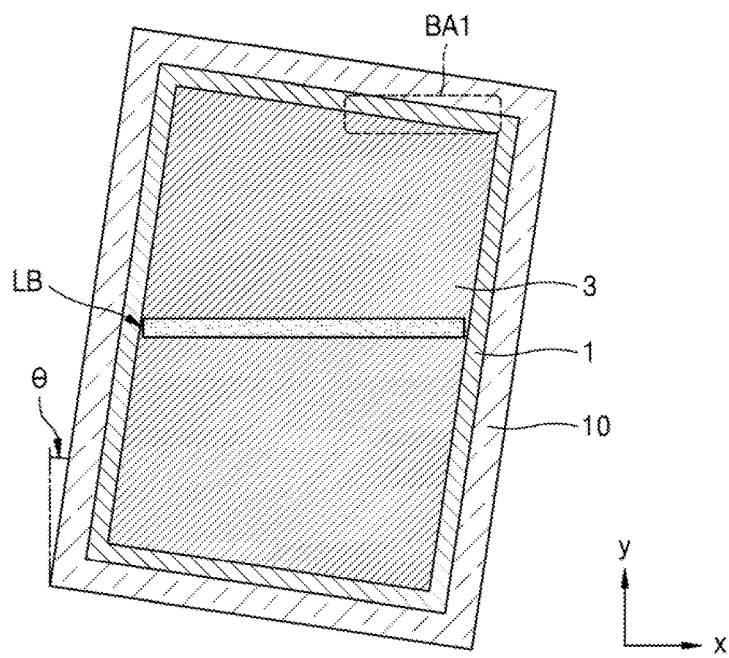
Figure 6:
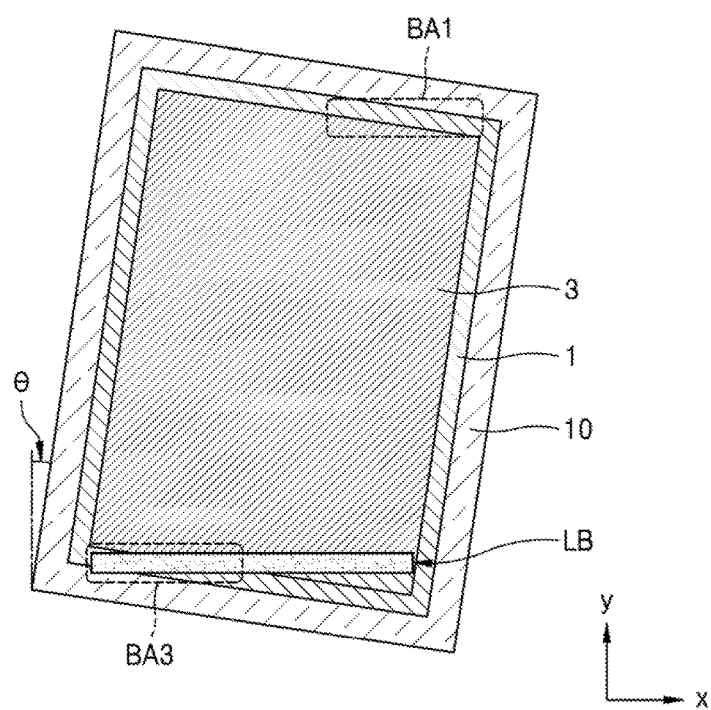

FIGS. 4 to 6 illustrate schematic plan views of a method of manufacturing a display apparatus by using a laser annealing apparatus according to an exemplary embodiment of the inventive concept. The laser annealing apparatus according to the exemplary embodiment shown in FIGS. 4 to 6 includes the substrate supporter 10, the laser beam irradiation unit, and the substrate transport unit. Some operations of certain components of the laser annealing apparatus shown in FIGS. 4 to 6 are different from some operations of the components of the laser annealing apparatus shown in FIGS. 1 to 3, as described herein.

Referring to the laser annealing apparatus illustrated in FIG. 4, the substrate transport unit rotates the substrate supporter 10 on which the substrate 1 having the amorphous silicon layer 3 thereon is arranged by an angle θ less than about 90 degrees. FIG. 4 illustrates that the substrate transport unit rotates the substrate supporter 10 by θ in a clockwise direction. Accordingly, the first direction (+x direction) that is the extension direction of the line laser beam LB is not substantially parallel to the edges of the substrate 1.

Once the substrate supporter 10 has been rotated, the substrate transport unit transports (e.g., moves) the substrate supporter 10, as illustrated in FIGS. 4 to 6. For example, the substrate transport unit transports the substrate supporter 10 both in the first direction (+x direction) and in the second direction (+y direction) at substantially the same time, as opposed to the previously described laser annealing apparatus in which the substrate transport unit transports the substrate supporter 10 only in the second direction (+y direction). While the substrate transport unit transports the substrate supporter 10 both in the first direction (+x direction) and in the second direction (+y direction) at substantially the same time, the laser beam irradiation unit irradiates the line laser beam LB onto the substrate 1 arranged on the substrate supporter 10 and having the amorphous silicon layer 3 thereon multiple times. Thus, the amorphous silicon layer 3 is transformed into a polysilicon layer.

When the laser annealing is performed as described above, the line laser beam LB is irradiated onto the upper right area BA1 of the substrate 1 that is not covered by the amorphous silicon layer 3 at an initial phase of the laser annealing, as illustrated in FIG. 4. However, the line laser beam LB is not irradiated onto an upper left area that is not covered by the amorphous silicon layer 3 because a length L of the line laser beam LB in the first direction (+x direction) is limited. The length L of the line laser beam LB in the first direction (+x direction) may have a relationship of $L=L_0*\cos(\theta)$, in which $L_0$ is a length of the amorphous silicon layer 3 in the first direction (+x direction) when the substrate transport unit does not rotate the substrate supporter 10.

Then, the substrate transport unit moves the substrate supporter 10 both in the first direction (+x direction) and in the second direction (+y direction) at substantially the same time, and the laser beam irradiation unit irradiates the line laser beam LB onto the substrate 1 arranged on the substrate supporter 10 and having the amorphous silicon layer 3 thereon multiple times, thereby transforming the amorphous silicon layer 3 into a polysilicon layer. If the substrate transport unit transports the substrate supporter 10 only in the second direction (+y direction), the length L of the line laser beam LB is less than a length of the line laser beam LB in the previously described laser annealing apparatus, and thus, an area of a portion of the amorphous silicon layer 3 in which the line laser beam LB is not irradiated rapidly increases. However, in the case of the laser annealing apparatus according to the exemplary embodiment as illustrated in FIGS. 4 to 6, the substrate transport unit transports the substrate supporter 10 both in the first direction (+x direction) and in the second direction (+y direction) at substantially the same time. As a result, the line laser beam LB may be irradiated onto most portions of the amorphous silicon layer 3 formed on the substrate 1.

In this case, as illustrated in FIG. 6, the line laser beam LB is irradiated onto the lower left area BA3 of the substrate 1 that is not covered by the amorphous silicon layer 3 at a late phase of the laser annealing process. However, the line laser beam LB is not irradiated onto an upper right area of the substrate 1 that is not covered by the amorphous silicon layer 3.

In the case of a laser annealing apparatus according to the exemplary embodiment of FIGS. 4 to 6, the line laser beam LB is irradiated onto most portions or an entire portion of the amorphous silicon layer 3 to transform the amorphous silicon layer 3 into a polysilicon layer. Further, an area of a portion of the substrate 1 in which the line laser beam LB is irradiated, from among portions of the substrate 1 that are not covered by the amorphous silicon layer 3, may decrease. Accordingly, damage to the substrate 1 including a polymer such as, for example, polyimide, may be prevented, and/or an occurrence rate of defects may decrease during the laser annealing. In addition, the occurrence of defects may be prevented and/or an occurrence rate of defects may decrease while a thin film transistor or a display device is subsequently formed.

When the substrate transport unit transports the substrate supporter 10 both in the first direction (+x direction) and in the second direction (+y direction) at substantially the same time, a velocity at which the substrate supporter 10 is transported in the second direction (+y direction) and a velocity at which the substrate supporter 10 is transported in the first direction (+x direction) are adjusted to allow the substrate transport unit to transport the substrate supporter 10 in such a manner that edges of the amorphous silicon layer 3 (in the +x direction and −x direction) that is rotated by θ correspond to both ends of the line laser beam LB, as illustrated in FIGS. 4 to 6. Therefore, according to an exemplary embodiment, when a velocity at which the substrate transport unit transports the substrate supporter 10 in the second direction (+y direction) is V, a velocity at which the substrate transport unit transports the substrate supporter 10 in the first direction (+x direction) is V*tan(θ).

FIGS. 7 to 11 illustrate schematic plan views of a method of manufacturing a display apparatus by using a laser annealing apparatus according to an exemplary embodiment of the inventive concept. The laser annealing apparatus according to the exemplary embodiment of FIGS. 7 to 11 further includes a first beam cutter BC1 and a second beam cutter BC2. The first beam cutter BC1 and the second beam cutter BC2 may shield at least some of the line laser beam LB emitted from the laser beam irradiation unit. A shielded area in which the line laser beam LB is shielded by the first beam cutter BC1 and the second beam cutter BC2 may increase or decrease during the laser annealing by moving the first beam cutter BC1 and/or the second beam cutter BC2 in the first direction (+x direction) or in a direction opposite to the first direction (e.g., a −x direction).

Figure 7:
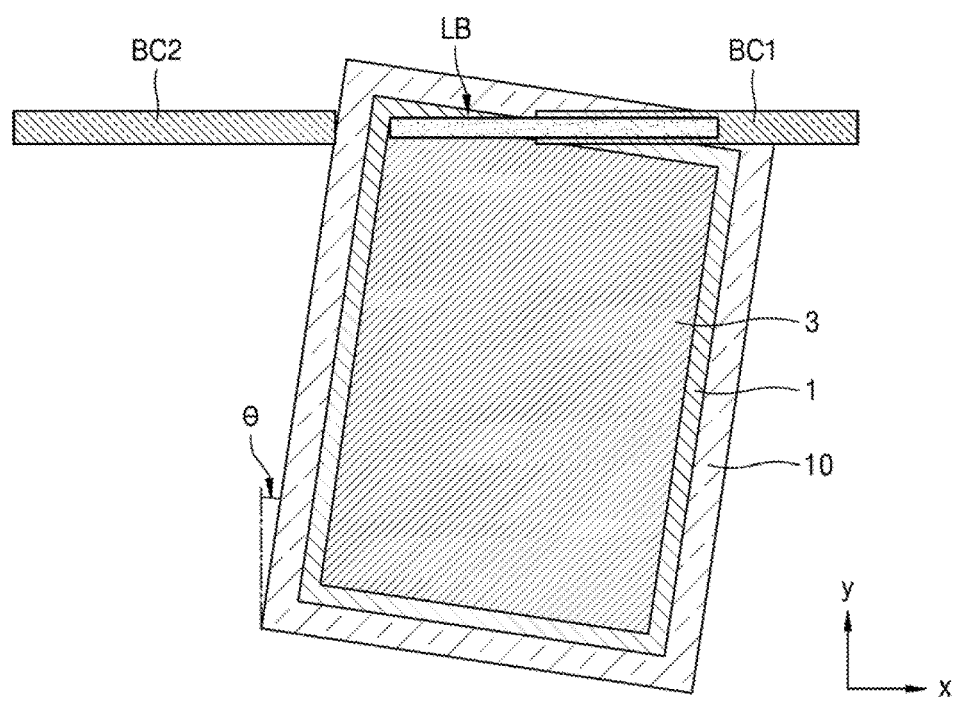
FIGS. 7 to 11 illustrate schematic plan views of a method of manufacturing a display apparatus by using a laser annealing apparatus according to an exemplary embodiment of the inventive concept.
Figure 8:
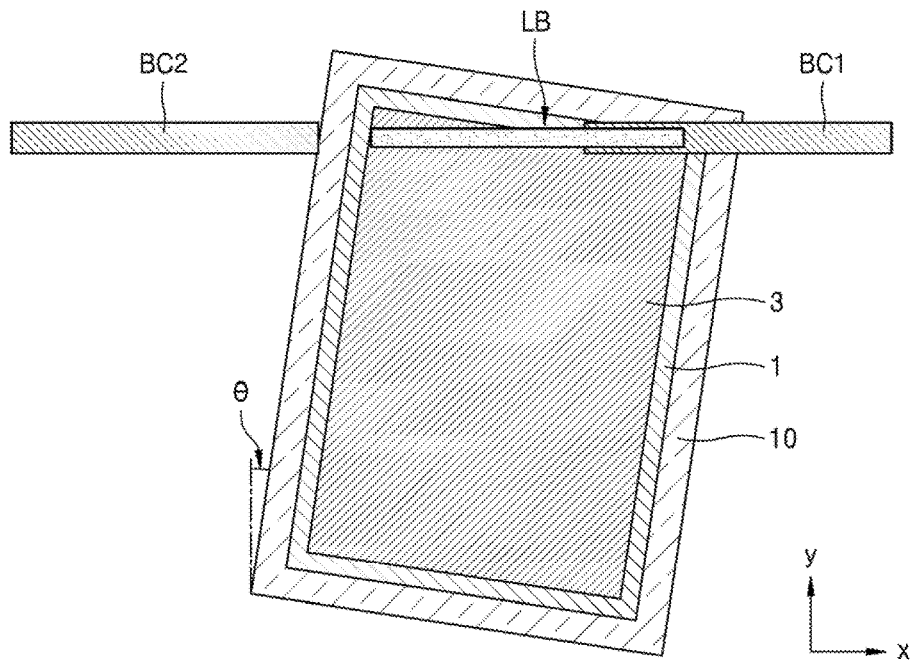
Figure 9:
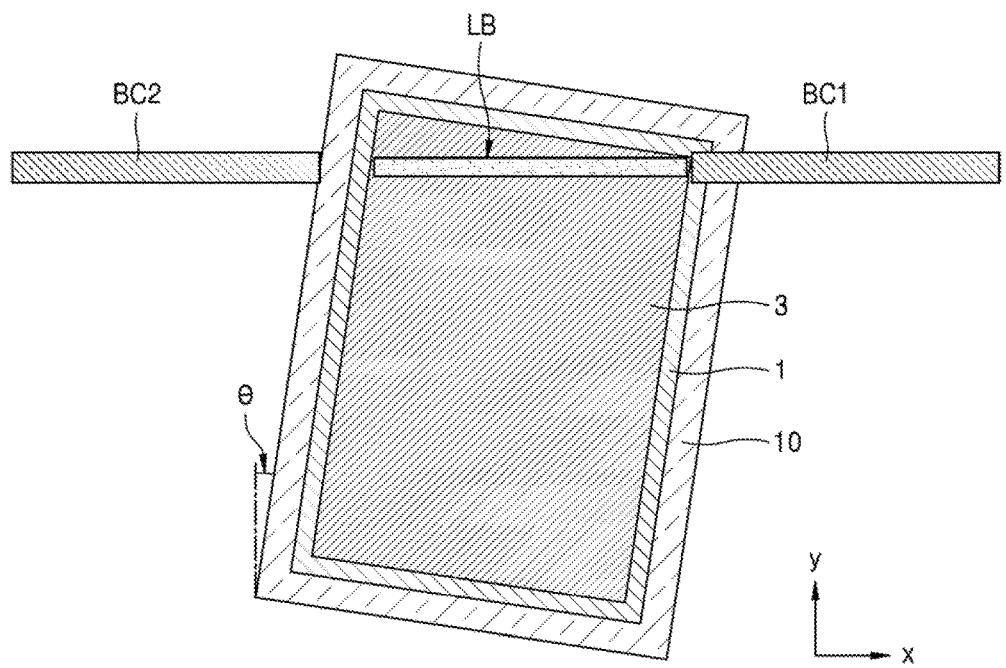

For example, as illustrated in FIG. 7, the line laser beam LB is shielded such that the line laser beam LB is not irradiated onto most portions of an upper surface of the substrate 1 that are not covered by the amorphous silicon layer 3 at an initial phase of the laser annealing. As illustrated in FIGS. 8 and 9, as the substrate transport unit transports the substrate supporter 10 both in the first direction (+x direction) and in the second direction (+y direction) at substantially the same time, the first beam cutter BC1 decreases the shield area in which the line laser beam LB emitted from the laser beam irradiation unit is shielded. This is done because an area of a portion in which the line laser beam LB reaches the amorphous silicon layer 3 increases, but an area of a portion in which the line laser beam LB reaches the substrate 1 decreases from among portions in which the line laser beam LB is irradiated. If the line laser beam LB is no longer irradiated onto the portion of the substrate 1 that is not covered by the amorphous silicon layer 3 when the substrate transport unit transports the substrate supporter 10 in the first direction (+x direction) and further in the second direction (+y direction), as illustrated in FIG. 9, the first beam cutter BC1 may not shield the line laser beam LB.

Figure 10:
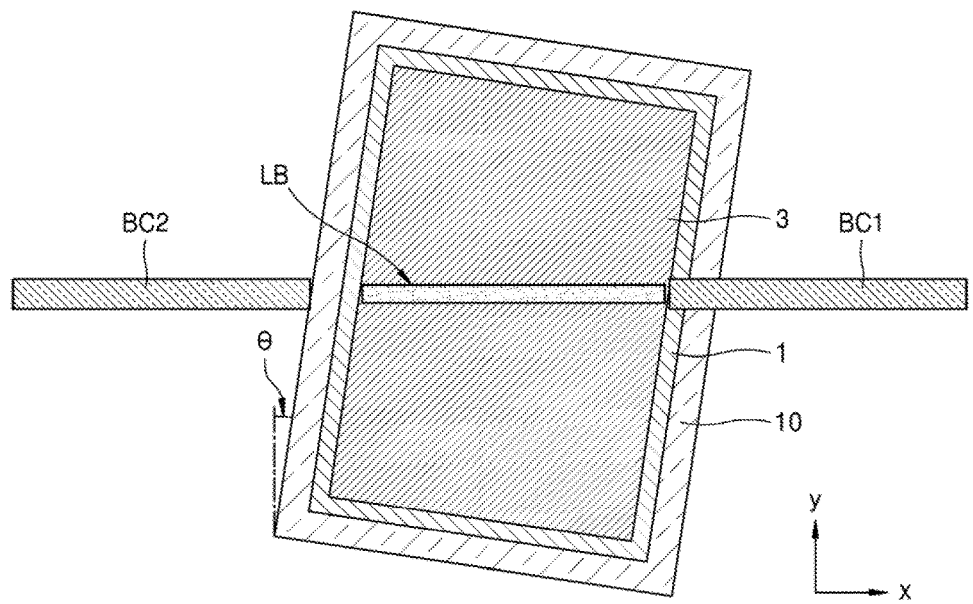
Figure 11:
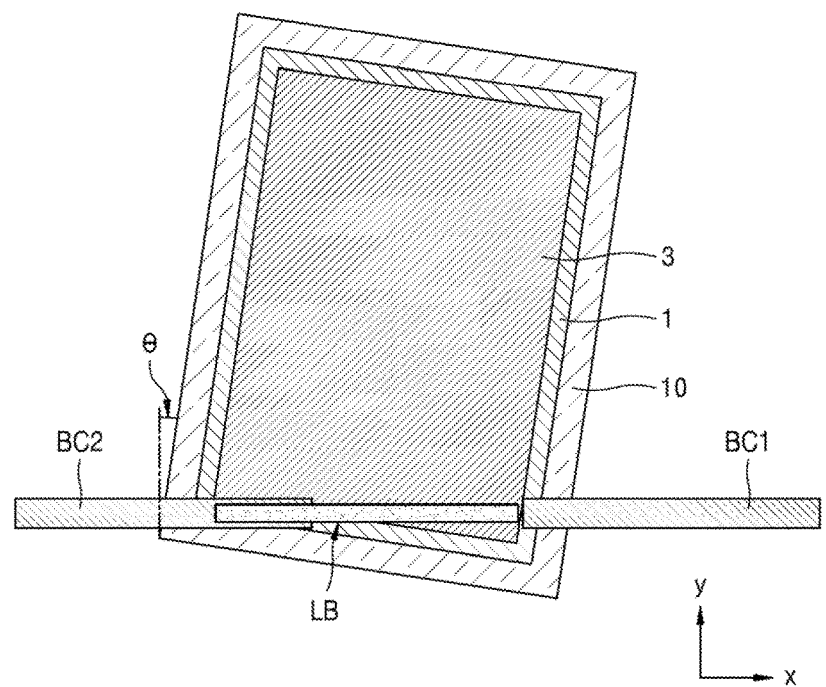

The substrate transport unit keeps transporting the substrate supporter 10 both in the first direction (+x direction) and in the second direction (+y direction) at substantially the same time, and then the line laser beam LB is irradiated onto the amorphous silicon layer 3, as illustrated in FIG. 10. As illustrated in FIG. 11, when the line laser beam LB is irradiated onto a bottom portion of the amorphous silicon layer 3, the second beam cutter BC2 starts to shield the line laser beam LB in such a manner that the line laser beam LB is not irradiated onto most of a bottom portion of the substrate 1 that is not covered by the amorphous silicon layer 3. As illustrated in FIGS. 10 and 11, as the substrate transport unit keeps transporting the substrate supporter 10 both in the first direction (+x direction) and in the second direction (+y direction) at substantially the same time, the second beam cutter BC2 increases an area of the shield area in which the line laser beam LB emitted from the laser beam irradiation unit is shielded by moving the second beam cutter BC2 in the first direction (+x direction). Thus, irradiation of the line laser beam LB onto most of the bottom portion of the substrate 1 may be prevented or reduced.

In the laser annealing apparatus according to the exemplary embodiment of FIGS. 7 to 11, compared to the laser annealing apparatus described with reference to FIGS. 4 to 6, irradiation of the line laser beam LB onto most of the top or bottom portion of the substrate 1 may be prevented or reduced. Accordingly, damage to the substrate 1 including a polymer such as, for example, polyimide may be prevented or reduced, and/or the occurrence rate of defects may decrease during the laser annealing process. In addition, the occurrence of defects may be prevented or reduced, and/or an occurrence rate of defects may decrease while a thin film transistor or a display device is subsequently formed.

As described with reference to FIGS. 7 to 11, according to an exemplary embodiment, a location of the first beam cutter BC1 in the second direction (+y direction), a location of the second beam cutter BC2 in the second direction (+y direction), and a location of the line laser beam LB are fixed, the substrate supporter 10 is transported by the substrate transport unit, and the first beam cutter BC1 and the second beam cutter BC2 move in the first direction (+x direction) or the direction opposite to the first direction (e.g., the −x direction) in a substantially straight line. Movement directions of the first beam cutter BC1 and the second beam cutter BC2 may be limited by, for example, a guard rail.

Figure 12:
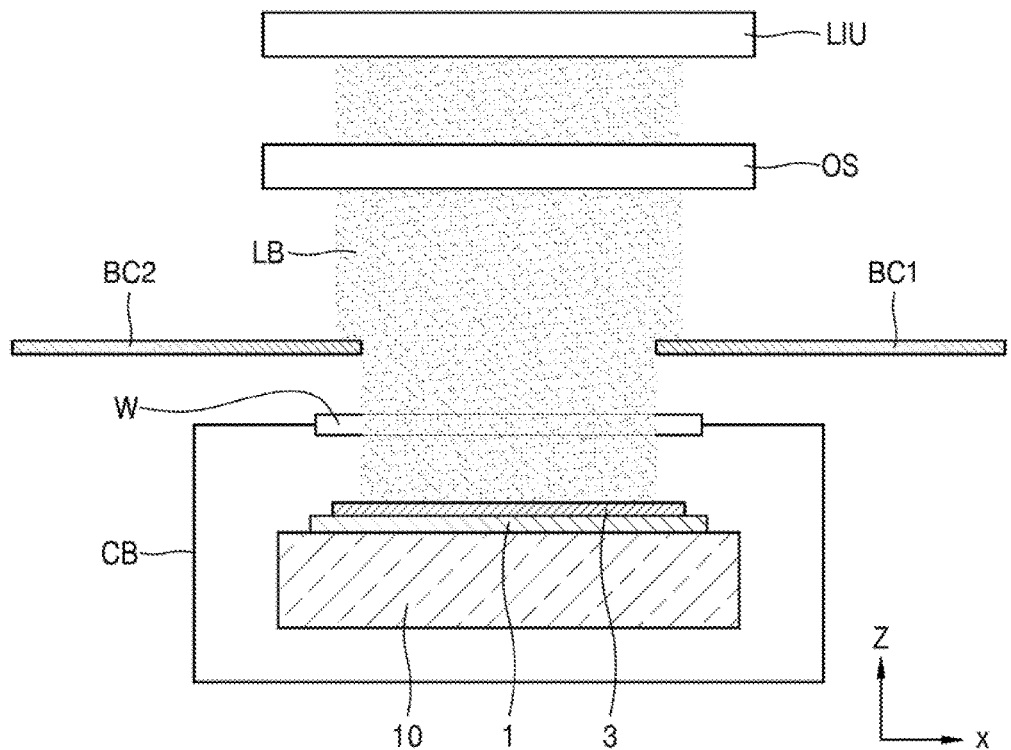
FIGS. 12 to 13 illustrate schematic side conceptual views of a method of manufacturing a display apparatus by using a laser annealing apparatus according to an exemplary embodiment of the inventive concept.
Figure 13:
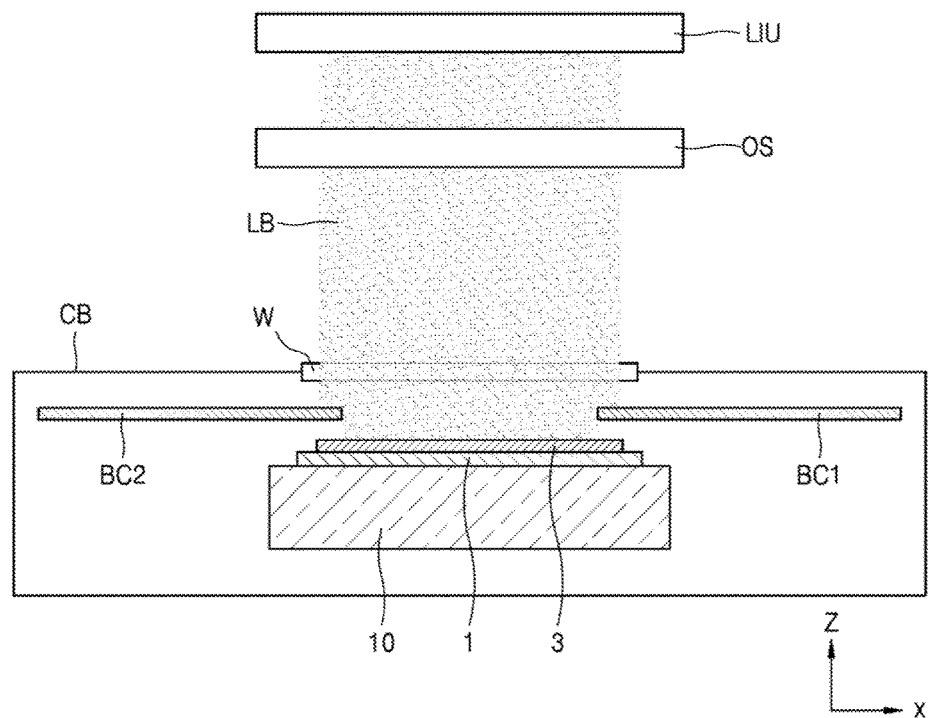

FIGS. 12 to 13 illustrate schematic side conceptual views of a method of manufacturing a display apparatus by using a laser annealing apparatus according to an exemplary embodiment of the inventive concept. As illustrated in FIG. 12, the laser annealing apparatus may further include a chamber CB. A laser beam irradiation unit LIU is located outside the chamber CB, and the substrate supporter 10 is located within the chamber CB, and thus may be transported by a substrate transport unit therein. The chamber CB has a window W. After the line laser beam LB emitted from the laser beam irradiation unit LIU passes through an optical system OS and then through the window W, the line laser beam LB may be irradiated onto the amorphous silicon layer 3 formed on the substrate 1 arranged on the substrate supporter 10. In this case, the first beam cutter BC1 and the second beam cutter BC2 may be located above the chamber CB in a +z direction.

Although the line laser beam LB may be emitted as a substantially straight line, the line laser beam LB may be diffracted due to the line laser beam LB being a type of light having an optical characteristic. For example, when some portions of the line laser beam LB are shielded by the first beam cutter BC1 and the second beam cutter BC2, other portions of the line laser beam LB that are not shielded by the first beam cutter BC1 and the second beam cutter BC2 may be scattered by, for example, diffraction. Thus, the line laser beam LB may be unintentionally irradiated onto some portions of the substrate 1 that are not covered by the amorphous silicon layer 3. To reduce the influence of this unintentional irradiation, the first beam cutter BC1 and the second beam cutter BC2 may be located within the chamber CB, as illustrated in FIG. 13. In this case, a distance between the substrate 1 and the first beam cutter BC1 and the second beam cutter BC2 may decrease. Accordingly, although the portions of the line laser beam LB that are not shielded by the first beam cutter BC1 and the second beam cutter BC2 may be scattered by, for example, diffraction, areas of the portions that are not covered by the amorphous silicon layer 3 and that are unintentionally irradiated by the line laser beam LB may be reduced.

FIGS. 14 to 19 illustrate schematic plan views of a method of manufacturing a display apparatus by using a laser annealing apparatus according to an exemplary embodiment of the inventive concept.

Referring to the exemplary embodiment of FIGS. 14 to 19, the first beam cutter BC1 and the second beam cutter BC2 rotationally move, unlike the laser annealing apparatus of FIGS. 7 to 11, which moves in a substantially straight manner. For example, as the first beam cutter BC1 and the second beam cutter BC2 rotate in a clockwise direction or a counterclockwise direction within a plane substantially parallel to the first plane defined by the first direction (+x direction) and the second direction (+y direction), an area of the shield area in which the line laser beam LB emitted from the laser beam irradiation unit is shielded may be increased or decreased.

Figure 14:
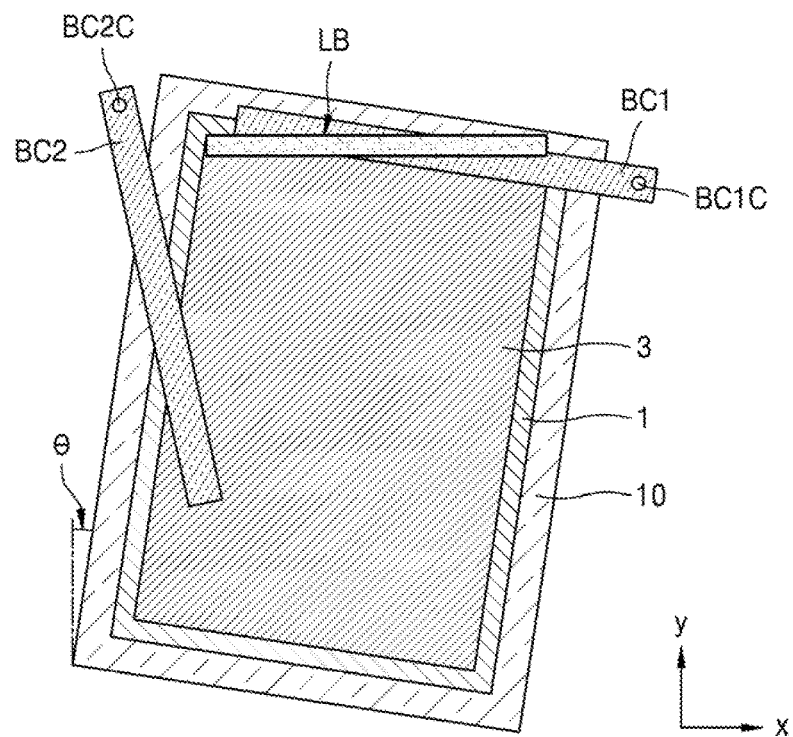
FIGS. 14 to 19 illustrate schematic plan views of a method of manufacturing a display apparatus by using a laser annealing apparatus according to an exemplary embodiment of the inventive concept.
Figure 15:
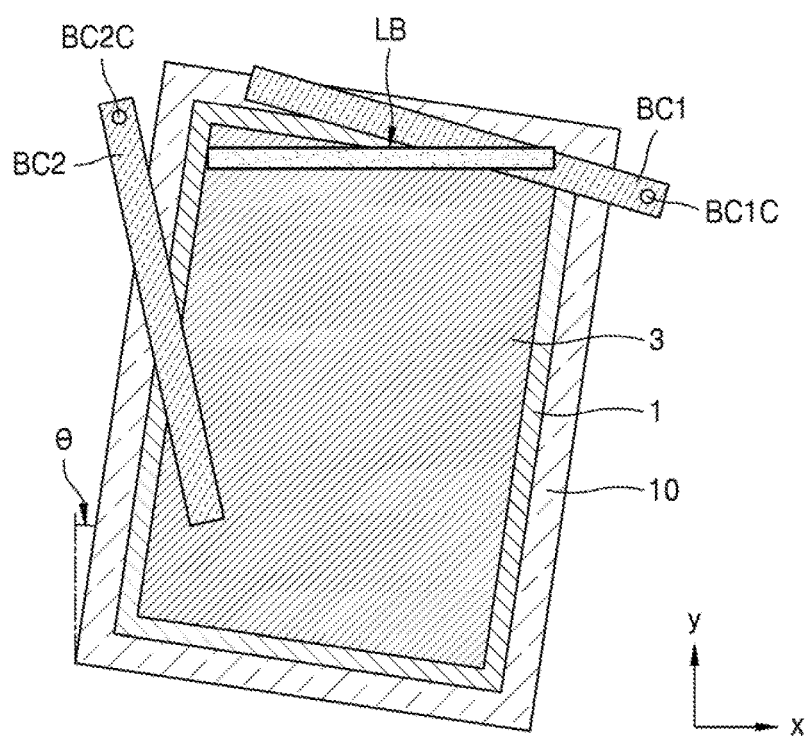
Figure 16:
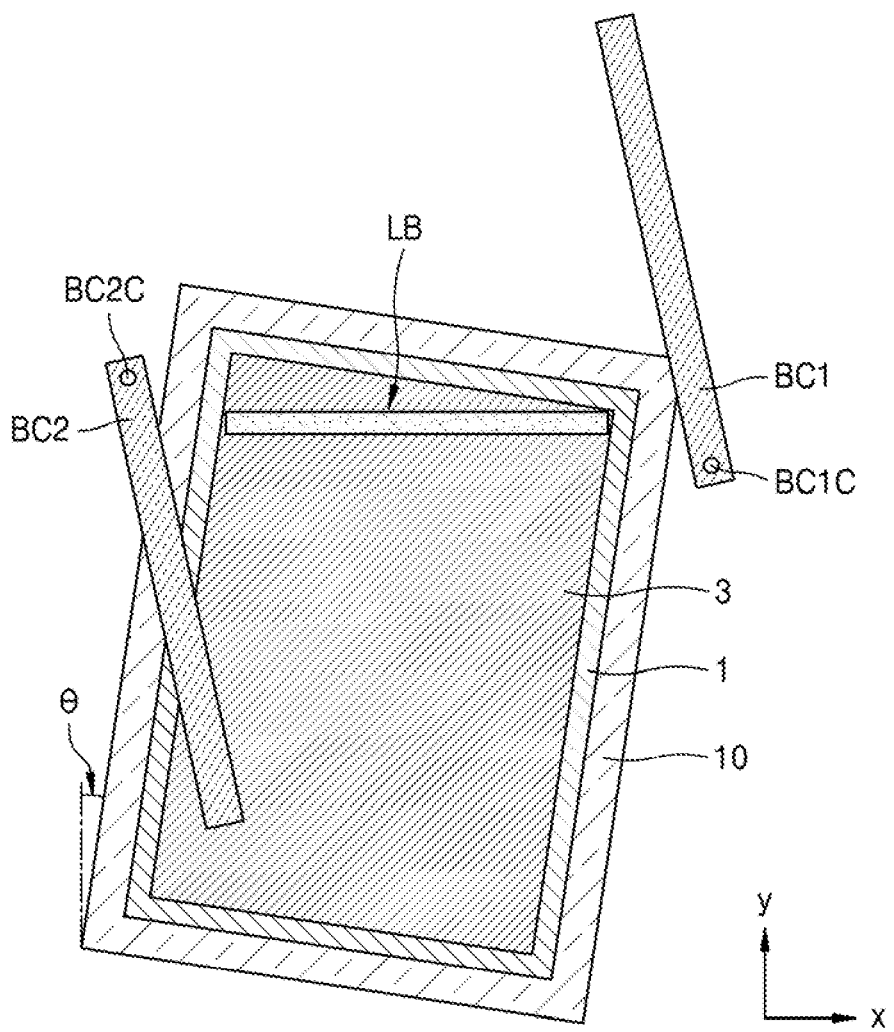

For example, as illustrated in FIG. 14, the first beam cutter BC1 shields the line laser beam LB in such a manner that the line laser beam LB is not irradiated onto most of a top portion of the substrate that is not covered by the amorphous silicon layer 3 at an initial phase of laser annealing. In addition, as illustrated in FIGS. 15 and 16, as the substrate transport unit transports the substrate supporter 10 both in the first direction (+x direction) and the second direction (+y direction) at substantially the same time, since an area of a portion in which the line laser beam LB reaches the amorphous silicon layer 3 increases, but an area of a portion in which the line laser beam LB reaches the substrate 1 decreases, the first beam cutter BC1 decreases the area of the shield area in which the line laser beam LB emitted from the laser beam irradiation unit is shielded by moving in the clockwise direction with respect to a first rotation axis BC1C. In a case in which the line laser beam LB is no longer irradiated onto the portion of the substrate 1 that is not covered by the amorphous silicon layer 3 when the substrate transport unit transports the substrate supporter 10 in the first direction (+x direction) and further in the second direction (+y direction), the first beam cutter BC1 may not shield the line laser beam LB.

Figure 17:
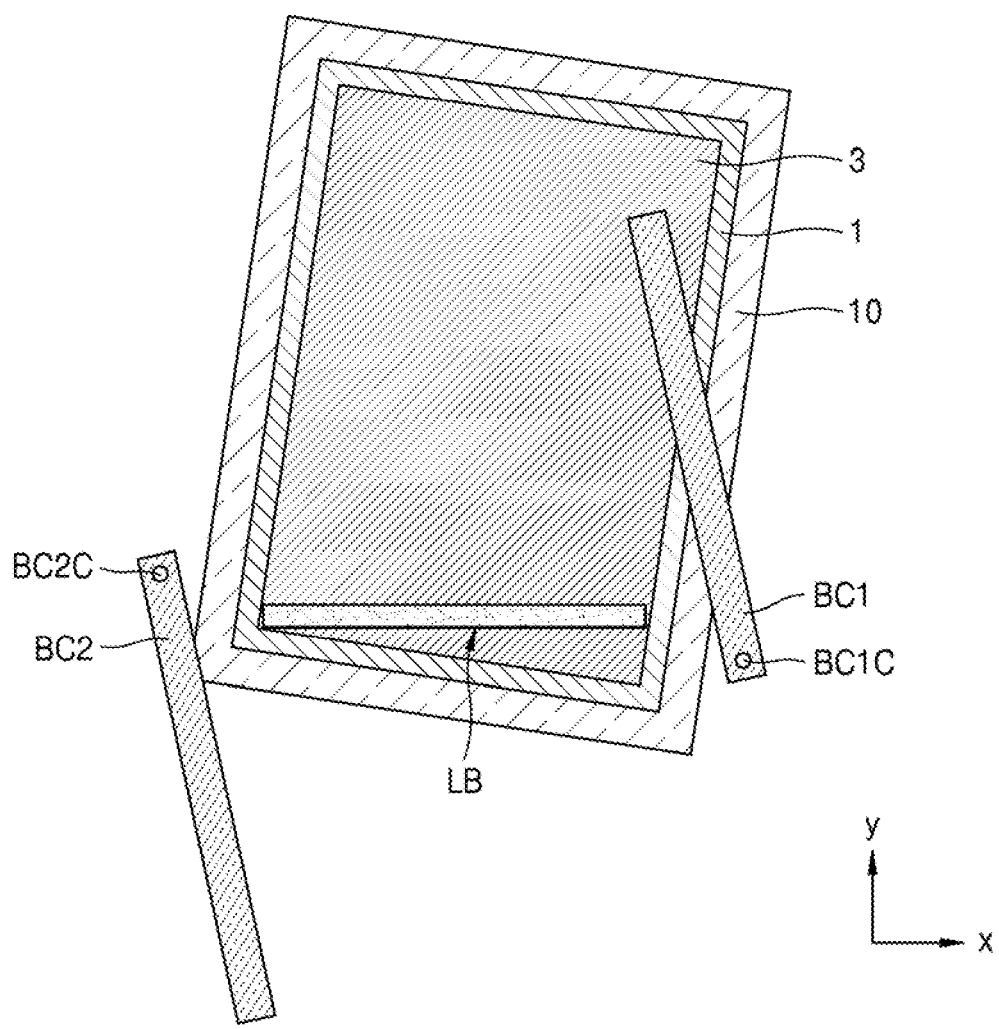
Figure 18:
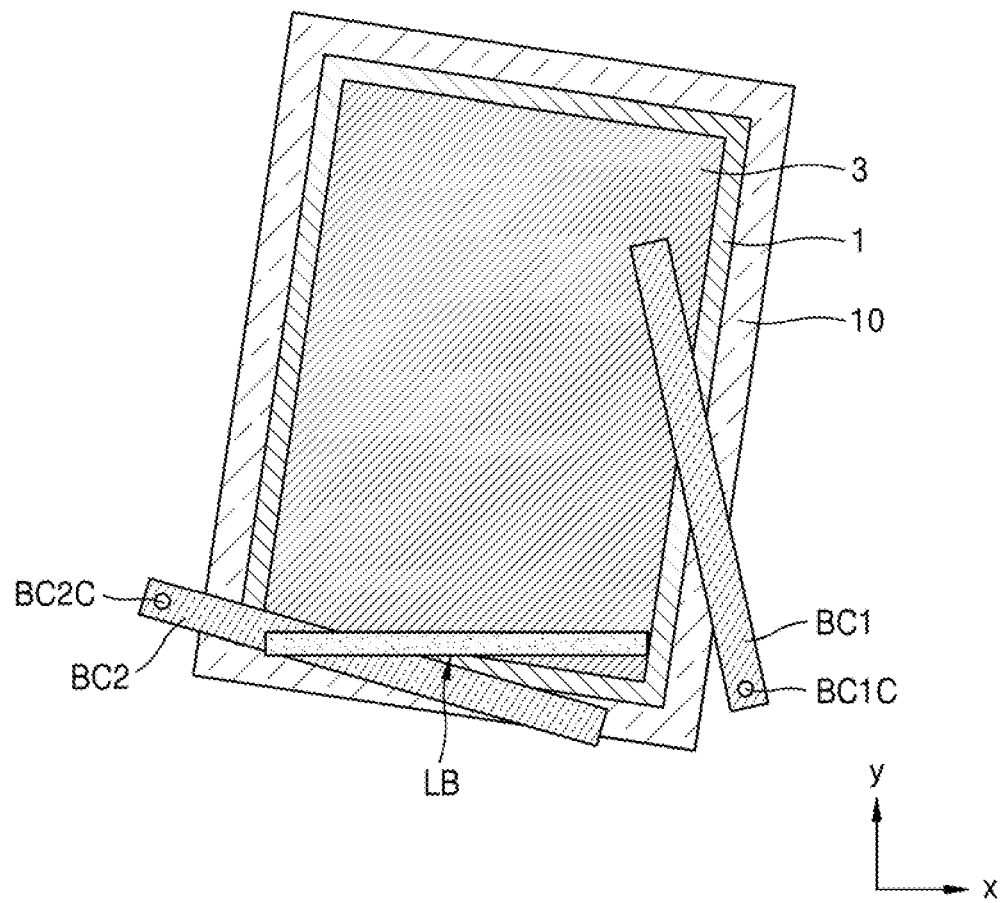

The substrate transport unit keeps transporting the substrate supporter 10 both in the first direction (+x direction) and in the second direction (+y direction) at substantially the same time, and then the line laser beam LB is irradiated onto the amorphous silicon layer 3, as illustrated in FIG. 17. As illustrated in FIG. 18, when the line laser beam LB is irradiated onto a bottom portion of the amorphous silicon layer 3, the second beam cutter BC2 starts to shield the line laser beam LB in such a manner that the line laser beam LB is not irradiated onto most of a bottom portion of the substrate 1 that is not covered by the amorphous silicon layer 3, which may be performed when the second beam cutter BC2 moves in the counterclockwise direction with respect to a second rotation axis BC2C.

Figure 19:
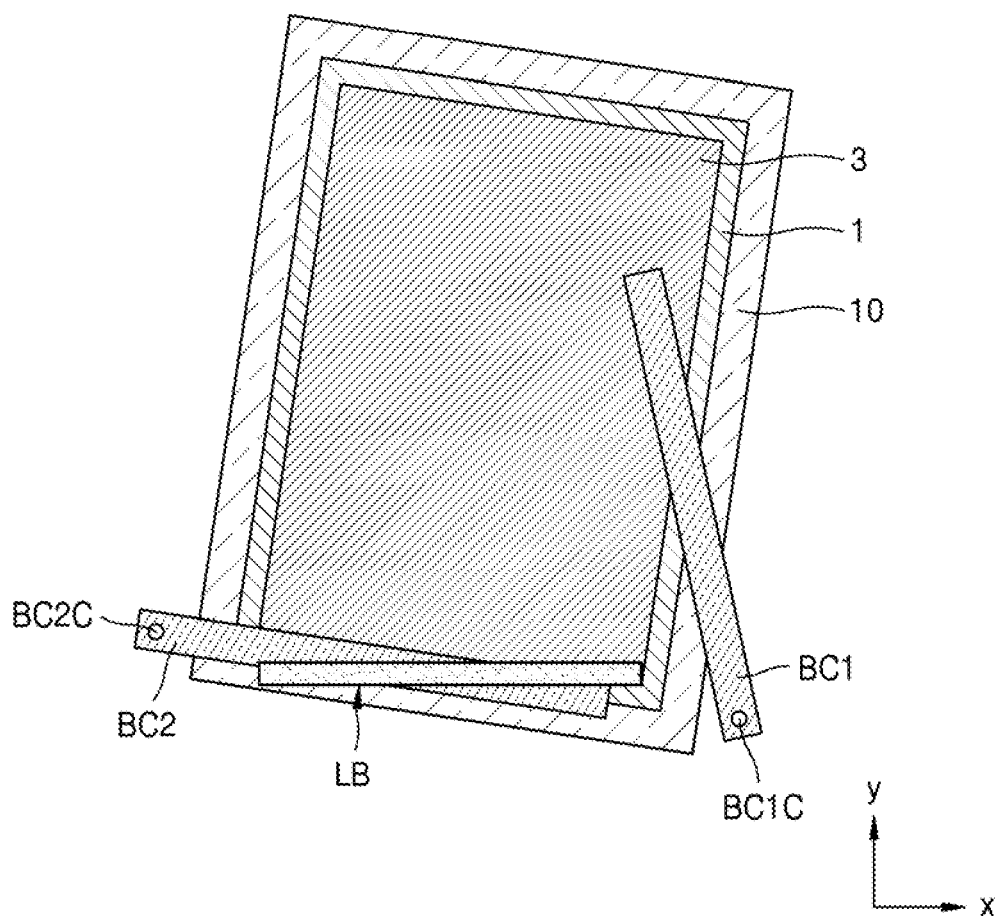

As illustrated in FIGS. 18 and 19, as the substrate transport unit keeps transporting the substrate supporter 10 both in the first direction (+x direction) and in the second direction (+y direction) at substantially the same time, the second beam cutter BC2 increases an area of the shield area in which the line laser beam LB emitted from the laser beam irradiation unit is shielded by moving in the counterclockwise direction with respect to the second rotation axis BC2C. Thus, irradiation of the line laser beam LB onto most of the bottom portion of the substrate 1 may be prevented or reduced.

In the laser annealing apparatus according to the exemplary embodiment of FIGS. 14 to 19, compared to the laser annealing apparatus described with reference to FIGS. 4 to 6, irradiation of the line laser beam LB onto most of the top or bottom portion of the substrate 1 may be prevented or reduced. Accordingly, damage to the substrate 1 including a polymer such as, for example, polyimide, may be prevented or reduced, and/or the occurrence rate of defects may decrease during the laser annealing. In addition, the occurrence of defects may be prevented or reduced, and/or an occurrence rate of defects may decrease while a thin film transistor or a display device is subsequently formed.

As described with reference to FIGS. 14 to 19, in an exemplary embodiment, a location of the line laser beam LB, a location of the first rotation axis BC1C, and a location of the second rotation axis BC2C are fixed, the substrate supporter 10 is transported by the substrate transport unit, and the first beam cutter BC1 and the second beam cutter BC2 rotationally move.

In an exemplary embodiment, the first beam cutter BC1 and the second beam cutter BC2 that rotationally move may also be located within the chamber CB, as illustrated in FIG. 13.

Exemplary embodiments of the inventive concept include the laser annealing apparatus described herein, a laser annealing method using the laser annealing apparatus described herein, and a method of manufacturing a display apparatus by using the laser annealing apparatus described herein.

A method of manufacturing a display apparatus according to an exemplary embodiment may include forming the amorphous silicon layer 3 on the substrate 1 and irradiating the line laser beam LB extending in the first direction (+x direction) onto the amorphous silicon layer 3 to transform the amorphous silicon layer 3 into a polysilicon layer. In this case, the line laser beam LB may be irradiated onto the substrate 1 on which the amorphous silicon layer 3 is formed multiple times while the substrate 1 moves both in the first direction (+x direction) and in the second direction (+y direction) crossing the first direction (+x direction) at substantially the same time, and in a state in which the substrate 1 is rotated by an angle θ less than about 90 degrees within the first plane (e.g., an xy plane) defined by the first direction (+x direction) and the second direction (+y direction), as illustrated in FIGS. 4 to 6.

Referring to the method of manufacturing the display apparatus according to the exemplary embodiment of FIGS. 14 to 19, at an initial phase of the laser annealing, the line laser beam LB is irradiated onto the upper right area BA1 of the substrate 1 that is not covered by the amorphous silicon layer 3, but is not irradiated onto the upper left area that is not covered by the amorphous silicon layer 3, as illustrated in FIG. 4. As illustrated in FIG. 6, at a later phase of the laser annealing, the line laser beam LB is irradiated onto the lower left area BA3 of the substrate 1 that is not covered by the amorphous silicon layer 3, but is not irradiated onto the lower right area of the substrate 1 that is not covered by the amorphous silicon layer 3. Therefore, according to the method of manufacturing the display apparatus according to the present exemplary embodiment, the line laser beam LB is irradiated onto most portions or an entire portion of the amorphous silicon layer 3 formed on the substrate 1 in order to transform the amorphous silicon layer 3 into a polysilicon layer. An area of a portion in which the line laser beam LB is irradiated, from among portions of the substrate that are not covered by the amorphous silicon layer 3, may decrease from among portions of the substrate that are not covered by the amorphous silicon layer 3.

A length L of the line laser beam LB in the first direction (+x direction) may have a relationship of $L=Lo*\cos(\theta)$, in which Lo is a length of the amorphous silicon layer 3 in the first direction (+x direction) when the substrate 1 is not rotated.

When the substrate 1 is moved both in the first direction (+x direction) and in the second direction (+y direction) at substantially the same time, a velocity at which the substrate 1 is moved in the second direction (+y direction) and a velocity at which the substrate 1 is moved in the first direction (+x direction) are adjusted to allow the substrate 1 to be moved in such a manner that edges of the amorphous silicon layer 3 (in the +x direction and −x direction) that is rotated by θ correspond to both ends of the line laser beam LB, as illustrated in FIGS. 4 to 6. Therefore, when a velocity at which the substrate 1 is moved in the second direction (+y direction) is V, a velocity at which the substrate 1 is moved in the first direction (+x direction) may be $V*\tan(\theta)$.

After the amorphous silicon layer 3 is transformed into a polysilicon layer through the laser annealing process, multiple thin film transistors may be formed by using the polysilicon layer. A display apparatus may be manufactured at a high yield by forming display devices, for example, organic light-emitting devices, electrically connected to the thin film transistors.

According to a method of manufacturing a display apparatus according to an exemplary embodiment of the inventive concept, the first beam cutter BC1 and the second beam cutter BC2 may be used as illustrated in FIGS. 7 to 11. For example, as illustrated in FIG. 7, the first beam cutter BC1 may shield the line laser beam LB in such a manner that the line laser beam LB is not irradiated onto most of the top portion of the substrate 1 that is not covered by the amorphous silicon layer 3 at the initial phase of the laser annealing. As illustrated in FIGS. 8 and 9, as the substrate 1 is moved both in the first direction (+x direction) and in the second direction (+y direction) at substantially the same time, the first beam cutter BC1 moves in the first direction (+x direction) and the area of the shield area in which the line laser beam LB is shielded decreases, since the area of the portion in which the line laser beam LB reaches the amorphous silicon layer 3 increases, but the area of the portion in which the line laser beam LB reaches the substrate 1 decreases from among the portions in which the line laser beam LB is irradiated. In a case in which the line laser beam LB is no longer irradiated onto the portion of the substrate 1 that is not covered by the amorphous silicon layer 3 when the substrate transport unit transports the substrate supporter 10 in the first direction (+x direction) and further in the second direction (+y direction), as illustrated in FIG. 9, the first beam cutter BC1 may not shield the line laser beam LB.

The substrate 1 is moved both in the first direction (+x direction) and in the second direction (+y direction) at substantially the same time, and then the line laser beam LB is irradiated onto the amorphous silicon layer 3, as illustrated in FIG. 10. As illustrated in FIG. 11, when the line laser beam LB is irradiated onto the bottom portion of the amorphous silicon layer 3, the second beam cutter BC2 starts to shield the line laser beam LB in such a manner that the line laser beam LB is not irradiated onto most of the bottom portion of the substrate 1 that is not covered by the amorphous silicon layer 3. As illustrated in FIGS. 10 and 11, as the substrate 1 keeps moving both in the first direction (+x direction) and in the second direction (+y direction) at substantially the same time, the second beam cutter BC2 increases the area of the shield area in which the line laser beam LB emitted from the laser beam irradiation unit is shielded by moving the second beam cutter BC2 in the first direction (+x direction). Thus, the irradiation of the line laser beam LB onto most of the bottom portion of the substrate 1 may be prevented or reduced.

In the method of manufacturing the display apparatus according to the exemplary embodiment of FIGS. 14 to 19, compared to the method of manufacturing the display apparatus described with reference to FIGS. 4 to 6, the irradiation of the line laser beam LB onto most of the top or bottom portion of the substrate 1 may be prevented or reduced. Accordingly, damage to the substrate 1 including a polymer such as, for example, polyimide, may be prevented or reduced, and/or the occurrence rate of defects may decrease during the laser annealing. In addition, the occurrence of defects may be prevented or reduced, and/or an occurrence rate of defects may decrease while a thin film transistor or a display device is subsequently formed.

According to a method of manufacturing a display apparatus according to an exemplary embodiment, as illustrated in FIGS. 14 to 19, the first beam cutter BC1 and the second beam cutter BC2 may be used. However, according to the method of manufacturing the display apparatus according to the present exemplary embodiment, the first beam cutter BC1 and the second beam cutter BC2 rotationally move, unlike the first beam cutter BC1 and the second beam cutter BC2 of FIGS. 7 to 11 that move in a substantially straight line. For example, as the first beam cutter BC1 and the second beam cutter BC2 rotate in the clockwise direction or counterclockwise direction within the plane substantially parallel to the first plane defined by the first direction (+x direction) and the second direction (+y direction), the shield area in which the line laser beam LB emitted from the laser beam irradiation unit is shielded may be increased or decreased.

For example, as illustrated in FIG. 14, the first beam cutter BC1 may shield the line laser beam LB in such a manner that the line laser beam LB is not irradiated onto most of the top portion of the substrate 1 that is not covered by the amorphous silicon layer 3 at the initial phase of laser annealing. In addition, as illustrated in FIGS. 15 and 16, as the substrate 1 is moved both in the first direction (+x direction) and in the second direction (+y direction) at substantially the same time, the first beam cutter BC1 decreases the area of the shield area in which the line laser beam LB emitted from the laser beam irradiation unit is shielded by moving in the clockwise direction with respect to the first rotation axis BC1C, since the area of the portion in which the line laser beam LB reaches the amorphous silicon layer 3 increases, but the area of the portion in which the line laser beam LB reaches the substrate 1 decreases from among the portions in which the line laser beam LB is irradiated. In a case in which the line laser beam LB is no longer irradiated onto the portion of the substrate 1 that is not covered by the amorphous silicon layer 3 when the substrate 1 is moved in the first direction (+x direction) and further in the second direction (+y direction), as illustrated in FIG. 16, the first beam cutter BC1 may not shield the line laser beam LB.

The substrate 1 keeps moving both in the first direction (+x direction) and in the second direction (+y direction) at substantially the same time, and then the line laser beam LB is irradiated onto the amorphous silicon layer 3, as illustrated in FIG. 17. As illustrated in FIG. 18, when the line laser beam LB is irradiated onto the bottom portion of the amorphous silicon layer 3, the second beam cutter BC2 starts to shield the line laser beam LB in such a manner that the line laser beam LB is not irradiated onto most of the bottom portion of the substrate 1 that is not covered by the amorphous silicon layer 3, which may be performed when the second beam cutter BC2 moves in the counterclockwise direction with respect to the second rotation axis BC2C.

As illustrated in FIGS. 18 and 19, as the substrate 1 keeps moving both in the first direction (+x direction) and in the second direction (+y direction) at substantially the same time, the second beam cutter BC2 increases the area of the shield area in which the line laser beam LB emitted from the laser beam irradiation unit is shielded by moving in the counterclockwise direction with respect to the second rotation axis BC2C. Thus, the irradiation of the line laser beam LB onto most of the bottom portion of the substrate 1 may be prevented or reduced.

In the method of manufacturing the display apparatus according to the exemplary embodiment of FIGS. 14 to 19, compared to the method of manufacturing the display apparatus described with reference to FIGS. 4 to 6, the irradiation of the line laser beam LB onto most of the top or bottom portion of the substrate 1 may be prevented or reduced. Accordingly, damage to the substrate 1 including a polymer such as, for example, polyimide, may be prevented or reduced, and/or the occurrence rate of defects may decrease during the laser annealing. In addition, the occurrence of defects may be prevented or reduced, and/or an occurrence rate of defects may decrease while a thin film transistor or a display device is subsequently formed.

According to the exemplary embodiments of the inventive concept described above, a laser annealing apparatus for reducing an occurrence rate of defects during manufacture and a method of manufacturing a display apparatus by using the laser annealing apparatus are provided. However, the scope of the inventive concept is not limited thereto.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method of manufacturing a display apparatus, comprising:
applying a line laser beam onto an amorphous silicon layer formed on a substrate, wherein the line laser beam extends in a first direction,
wherein applying the line laser beam onto the amorphous silicon layer comprises:
applying the line laser beam onto the amorphous silicon layer multiple times while the substrate is moved in both the first direction and in a second direction crossing the first direction at substantially a same time,
wherein the line laser beam is applied onto the amorphous silicon layer while the substrate is rotated by an angle θ less than about 90 degrees within a first plane defined by the first direction and the second direction, the angle θ being an angle between the second direction and an edge of the substrate.

2. The method of claim 1, wherein the first direction and the second direction are substantially perpendicular to each other, the substrate is moved in the second direction at a velocity of V, and the substrate is moved in the first direction at a velocity of V*tan(θ).

3. The method of claim 1, wherein applying the line laser beam onto the amorphous silicon layer further comprises:
shielding at least some of the line laser beam by a beam cutter while the substrate is moved in the second direction; and
decreasing a shield area in which the line laser beam is shielded by moving the beam cutter in the first direction or in a direction opposite to the first direction while the substrate is moved in the second direction.

4. The method of claim 3, wherein applying the line laser beam onto the amorphous silicon layer further comprises:
applying the line laser beam onto the amorphous silicon layer of the substrate through a window of a chamber, wherein the substrate having the amorphous silicon layer and the beam cutter are located within the chamber.

5. The method of claim 1, wherein applying the line laser beam onto the amorphous silicon layer further comprises:
shielding at least some of the line laser beam by a beam cutter while the substrate is moved in the second direction; and
increasing a shield area in which the line laser beam is shielded by moving the beam cutter in the first direction or in a direction opposite to the first direction while the substrate is moved in the second direction.

6. The method of claim 5, wherein applying the line laser beam onto the amorphous silicon layer further comprises:
applying the line laser beam onto the amorphous silicon layer of the substrate through a window of a chamber, wherein the substrate having the amorphous silicon layer and the beam cutter are located within the chamber.

7. The method of claim 1, wherein applying the line laser beam onto the amorphous silicon layer further comprises:
shielding at least some of the line laser beam by a beam cutter while the substrate is moved in the second direction; and
decreasing a shield area in which the line laser beam is shielded by rotating the beam cutter in a clockwise direction or in a counterclockwise direction within a plane substantially parallel to the first plane while the substrate is moved in the second direction.

8. The method of claim 7, wherein applying the line laser beam onto the amorphous silicon layer further comprises:
applying the line laser beam onto the amorphous silicon layer of the substrate through a window of a chamber, wherein the substrate having the amorphous silicon layer and the beam cutter are located within the chamber.

9. The method of claim 1, wherein applying the line laser beam onto the amorphous silicon layer further comprises:
   shielding at least some of the line laser beam by a beam cutter while the substrate is moved in the second direction; and
   increasing a shield area in which the line laser beam is shielded by rotating the beam cutter in a clockwise direction or in a counterclockwise direction within a plane substantially parallel to the first plane while the substrate is moved in the second direction.

10. The method of claim 9, wherein applying the line laser beam onto the amorphous silicon layer further comprises:
    applying the line laser beam onto the amorphous silicon layer of the substrate through a window of a chamber,
    wherein the substrate having the amorphous silicon layer and the beam cutter are located within the chamber.

11. A method of manufacturing a display apparatus, comprising:
    rotating a substrate supporter by an angle θ less than about 90 degrees within a first plane defined by a first direction and a second direction crossing the first direction, the angle θ being an angle between the second direction and an edge of the substrate, wherein a substrate having an amorphous silicon layer is disposed on the substrate supporter;
    applying a line laser beam onto the amorphous silicon layer, wherein the line laser beam extends in the first direction; and
    moving the rotated substrate supporter having the substrate disposed thereon in the first direction and in the second direction at substantially a same time,
    wherein the line laser beam is applied multiple times onto the substrate while the substrate supporter is moved in the first direction and in the second direction.

12. The method of claim 11, wherein the first direction and the second direction are substantially perpendicular to each other, the substrate is moved in the second direction at a velocity of V, and the substrate is moved in the first direction at a velocity of V*tan(θ).

13. The method of claim 11, further comprising:
    shielding at least some of the line laser beam by a beam cutter while the substrate is moved in the second direction; and
    adjusting a shield area in which the line laser beam is shielded by moving the beam cutter in the first direction or in a direction opposite to the first direction while the substrate supporter having the substrate disposed thereon is moved in the second direction.

14. A method of manufacturing a display apparatus, comprising:
    applying a line laser beam onto an amorphous silicon layer formed on a substrate, wherein the line laser beam extends in a first direction,
    wherein applying the line laser beam onto the amorphous silicon layer comprises:
    applying the line laser beam onto the amorphous silicon layer multiple times while the substrate is moved in both the first direction and in a second direction crossing the first direction at substantially a same time,
    wherein the line laser beam is applied onto the amorphous silicon layer while the substrate is rotated by an angle θ less than about 90 degrees within a first plane defined by the first direction and the second direction; and
    shielding at least some of the line laser beam by a beam cutter while the substrate is moved in the second direction,
    wherein the line laser beam is applied onto the amorphous silicon layer of the substrate though a window of a chamber, and the substrate having the amorphous silicon layer and the beam cutter are located within the chamber.

15. The method of claim 14, wherein applying the line laser beam onto the amorphous silicon layer further comprises:
    decreasing a shield area in which the line laser beam is shielded by moving the beam cutter in the first direction or in a direction opposite to the first direction while the substrate is moved in the second direction.

16. The method of claim 14, wherein applying the line laser beam onto the amorphous silicon layer further comprises:
    increasing a shield area in which the line laser beam is shielded by moving the beam cutter in the first direction or in a direction opposite to the first direction while the substrate is moved in the second direction.

17. The method of claim 14, wherein applying the line laser beam onto the amorphous silicon layer further comprises:
    decreasing a shield area in which the line laser beam is shielded by rotating the beam cutter in a clockwise direction or in a counterclockwise direction within a plane substantially parallel to the first plane while the substrate is moved in the second direction.

18. The method of claim 14, wherein applying the line laser beam onto the amorphous silicon layer further comprises:
    increasing a shield area in which the line laser beam is shielded by rotating the beam cutter in a clockwise direction or in a counterclockwise direction within a plane substantially parallel to the first plane while the substrate is moved in the second direction.

* * * * *